(12) United States Patent
Glenn et al.

(10) Patent No.: US 7,619,262 B2
(45) Date of Patent: Nov. 17, 2009

(54) METHOD AND DEVICE FOR ELECTROSTATIC DISCHARGE PROTECTION

(75) Inventors: Jack L. Glenn, Kokomo, IN (US); Mark W. Gose, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 383 days.

(21) Appl. No.: 11/600,510

(22) Filed: Nov. 16, 2006

(65) Prior Publication Data
US 2008/0116480 A1 May 22, 2008

(51) Int. Cl.
*H01L 29/76* (2006.01)
(52) U.S. Cl. .................. 257/168; 438/199; 257/355
(58) Field of Classification Search .......... 438/199; 257/E29.015, E29.211, E21.388, 168
See application file for complete search history.

(56) References Cited
U.S. PATENT DOCUMENTS
7,176,529 B2 * 2/2007 Ohguro ............. 257/357

2005/0275065 A1 * 12/2005 Cogan et al. ............. 257/603
2008/0278874 A1 * 11/2008 Schwantes et al. ........... 361/56

* cited by examiner

*Primary Examiner*—Thao P. Le
(74) *Attorney, Agent, or Firm*—Jimmy L. Funke (57) ABSTRACT

Electrostatic discharge (ESD) protection is provided for an integrated circuit. In an aspect, a dynamic region having doped regions is formed on an epitaxy layer and substrate, and interconnects contact the dynamic region. In an aspect, the dynamic region operates as a back-to-back SCR that snaps back in both positive and negative voltage directions. In an aspect the dynamic region operates as an SCR that snaps back in a positive voltage direction and operates as a simple diode in a negative voltage direction. In another aspect, the dynamic region operates as an SCR that snaps back in a negative voltage direction and operates as a simple diode in a positive voltage direction. ESD protection over an adjustable and wide positive and negative voltage range is provided by varying widths and positioning of various doping regions. Breakdown voltages, critical voltages and critical currents are independently controlled.

20 Claims, 11 Drawing Sheets

METHOD AND DEVICE FOR ELECTROSTATIC DISCHARGE PROTECTION

FIELD OF THE INVENTION

The invention relates generally to a semiconductor integrated circuit, and more particularly to electrostatic discharge protection over a wide range of voltages, wherein breakdown voltages, critical voltages and critical currents are independently controlled.

BACKGROUND OF THE INVENTION

Numerous electronic circuits require protection from damage due to electrostatic discharge (ESD) caused by rapid discharge of static electricity from one conductor to another having a different potential. ESD can damage integrated circuits in computers, communication equipment, and countless other types of electronic equipment. Semiconductor circuits and components built to provide ESD protection are conventionally implemented using components such as silicon controlled rectifiers (SCRs), Shockley diodes, thyristors, latches, and metal gate field oxide (MGFO) devices. These conventional devices provide ESD protection between two terminals for either positive or negative ESD voltage swings. For example, an SCR usually snaps back in either a positive or a negative voltage direction and operates as a simple diode in the other direction. In addition, these devices are typically built to handle only a specific voltage or narrow voltage range, which is dictated by the doping levels of the diffusions that break down.

The ESD protection devices conventionally available generally suffer from lack of control of all critical device parameters, due to physical design parameters. These conventional devices are designed to provide ESD protection either in a positive voltage direction or a negative voltage direction. However, with the advent of complex electronic circuits and smart power integrated circuits (ICs), design requirements now include a greater range of values of breakdown voltages. Devices that can span a wide voltage range are finding an increasing need in applications including automotive and residential electronics. Since conventional ESD protection fails to handle a wide range of voltages and currents in both the positive and negative direction, a breakdown voltage requirement for a particular device can result in having to design a new device.

Therefore, there is a need to provide an ESD protection device to protect against a wide range of positive and negative voltages. Such a device structure should be flexible enough to provide varying ESD properties without significant re-design of device structure or addition/deletion of a significant number of doping regions.

SUMMARY OF THE INVENTION

The present invention provides an SCR device and method to protect circuit input and outputs against electrostatic discharge (ESD) over an adjustable and wide range of voltages, such as may be used in an integrated circuit. The present invention provides for independent control over breakdown voltage, NPN critical voltage, NPN critical current and PNP critical current, for either a positive or negative ESD event. In an embodiment, the present invention operates as an SCR that snaps back in both a positive and a negative direction, an SCR that snapbacks in a positive direction and operate as a simple diode in a negative direction, or an SCR that snapbacks in a negative direction and operates as a simple diode in a positive direction.

Features of the invention are achieved, in part, by employing a platform region, an interconnect region and a dynamic region. In an embodiment, the platform region includes a substrate region, an N-epitaxy layer, a first buried layer, a second buried layer, and a deep isolation implant. The interconnect region includes, in an embodiment, a dielectric, a ground contact and a pad contact. The dynamic region includes two Pwell regions, an Nwell region, a field oxide insulator, and N+ and P+ contact diffusions. In an embodiment, when the present invention operates as a back-to-back SCR, the dynamic region includes an Nwell region situated between two Pwell regions. In another embodiment, a P+ contact diffusion is replaced with a P+ Zener implant, providing a different breakdown voltage. In a further embodiment, a Pwell region and a P+ contact diffusion is replaced with a P-type high voltage implant, providing a greater breakdown voltage.

Under a positive voltage operation, breakdown voltages can be adjusted to a range of voltages by varying either, or both of, the Nwell to Pwell spacing, and the Pwell enclosure of the P+ contact diffusion. NPN critical voltage can be adjusted to a range of voltages by varying the total resistance from P+ diffusion region to the Ground N+ diffusion region, or by varying the sheet resistance of the Pwell region, the Nwell region, or the Pwell region. NPN critical current can be adjusted by varying the width of an NPN emitter (N+ contact diffusion) multiplied by a Pwell sheet resistance situated adjacent to the N+ contact diffusion. PNP critical current can be adjusted by varying the current gain of the PNP, which is adjusted by changing the spacing between the Pwell region and the Pwell region, as well as the relative doping levels of the pad side Pwell and the base region (N-epitaxy region). Under a negative voltage operation, when the NPN emitter is situated on a pad side and the PNP emitter is situated on a ground side, the design parameters for the breakdown voltages, critical voltages and critical currents are the opposite of that for a positive voltage device operation.

In an embodiment the present invention operates as an SCR for positive voltage and a simple diode for negative voltage. The Nwell region is stretched toward the pad connection such that a Pwell region is removed, and a P+ contact diffusion within the removed Pwell region is also removed. In another embodiment, the present invention operates as a simple diode for positive voltage and an SCR for negative voltage. The Nwell region is stretched toward the ground contact such that a Pwell region is removed, and a P+ contact diffusion within the removed Pwell region is also removed.

Other features and advantages of this invention will be apparent to a person of skill in the art who studies the invention disclosure. Therefore, the scope of the invention will be better understood by reference to an example of an embodiment, given with respect to the following figures.

BRIEF DESCRIPTION OF THE DRAWINGS

The foregoing aspects and many of the attendant advantages of this invention will become more readily appreciated by reference to the following detailed description, when taken in conjunction with the accompanying drawings, wherein.

DETAILED DESCRIPTION OF THE INVENTION

Exemplary embodiments are described with reference to specific configurations. Those of ordinary skill in the art will appreciate that various changes and modifications can be made while remaining within the scope of the appended claims. Additionally, well-known elements, devices, components, methods, process steps and the like may not be set forth in detail in order to avoid obscuring the invention. Further, unless indicated to the contrary, any numerical values set forth in the following specification and claims are approximations that may vary depending upon the desired characteristics sought to be obtained by the present invention.

The present invention provides a method and device to protect circuit input and outputs against electrostatic discharge (ESD) over a wide range of voltages, such as may be used in an integrated circuit. Breakdown voltages, critical voltages and critical currents are independently controlled. In an embodiment, the present invention operates as an SCR that snaps back in both a positive and a negative direction, an SCR that snapbacks in a positive direction and operates as a simple diode in a negative direction, or an SCR that snapbacks in a negative direction and operates as a simple diode in a positive direction. The present invention also employs varying implants including a P+ Zener implant and a P-type high voltage implant.

Characteristics of ESD protection previously described are controlled by device geometries in a layer of doping defined herein as a dynamic region. The dynamic region is characteristically formed on a platform region including a fixed substrate and an N-epitaxy layer, providing the ability to re-design a device structure to meet changing ESD voltage requirements without having to entirely redesign a device. Changing ESD voltage requirements include breakdown voltages, critical voltages and critical currents under either a positive or negative voltage operation.

As used herein, the term "semiconductor device" is an electronic component with electronic properties of a semiconductor material such as silicon, germanium and gallium arsenide. As used herein, the term "doping type" refers to the resulting charge conduction property of a semiconductor when certain type of atoms are added to the semiconductor in order to increase the number of free positive or negative charge carriers. When the resulting semiconductor contains excessive positive charge carriers or holes, the doping type is defined as P-type. When the resulting semiconductor contains excessive negative charge carriers or electrons, the doping type is defined as N-type. Additionally, the symbols P+ and N+ are used to indicate higher concentrations of P-type and N-type doping, respectively. Also as used herein, the term "dynamic region" refers to a collection of one or more doping regions grown on a substrate or epitaxy layer such that the voltage-current characteristics of the resulting ESD protection device are primarily controlled by geometry and doping levels of the regions at this layer. Further, as used herein, the term "terminal" refers to an electrical contact point. Such a contact point includes a pin on a semiconductor device, a pad on an electronic circuit, etc.

Figure 1A:
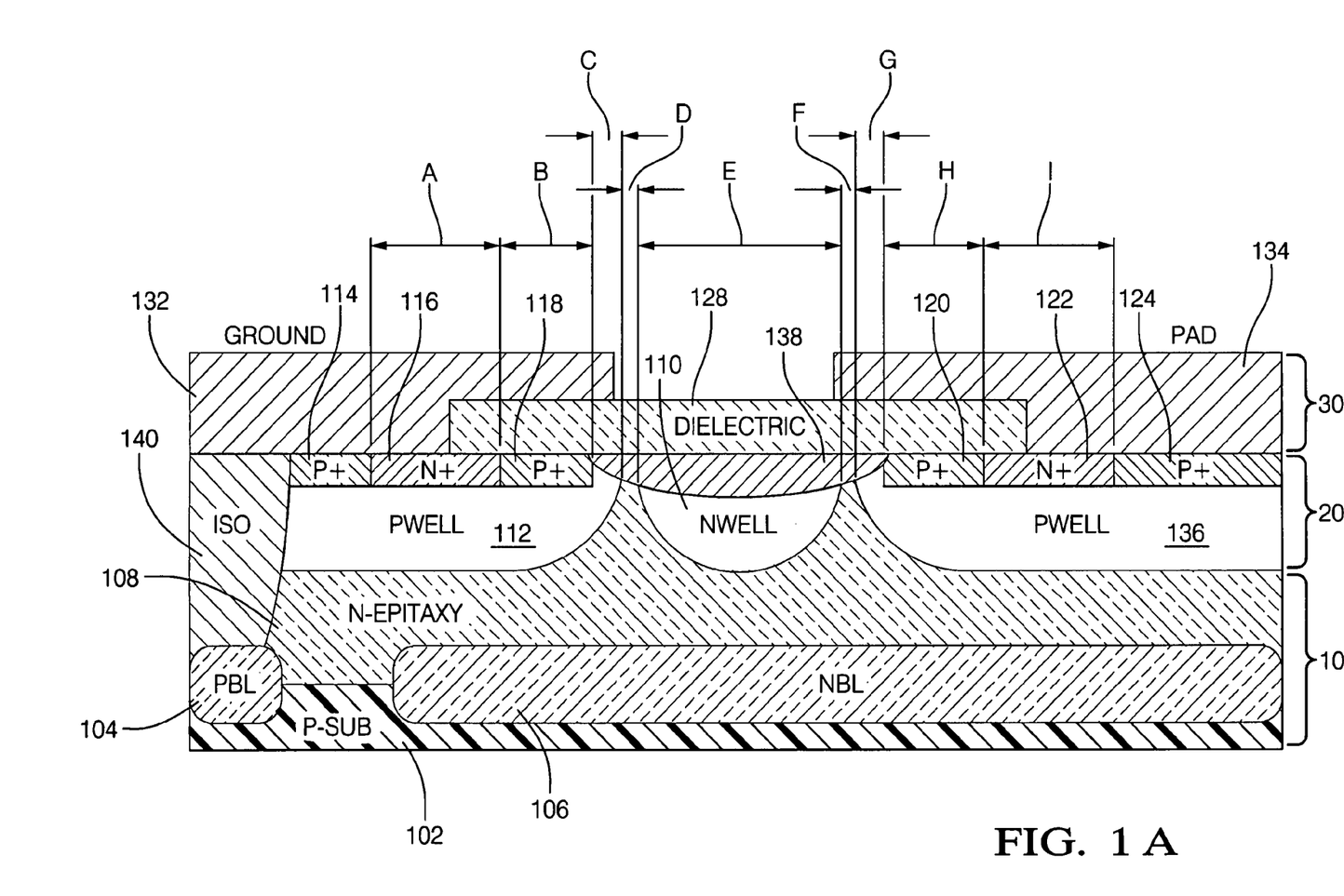
FIG. 1A is cross sectional view illustrating an ESD protection device, in accordance with an embodiment of the present invention.

Referring to the drawings wherein identical reference numerals denote the same elements throughout the various views, FIG. 1A illustrates a cross sectional view of an ESD protection device formed according to an embodiment of the present invention. A platform region 10, a dynamic region 20, and an interconnect region 30 are shown. As will be appreciated, the present invention dynamic region 20 can be formed on a different platform region as that shown. The illustrated platform region 10 is established including a P-type substrate 102 and an N+ buried layer 106 formed on the substrate 102. A P-buried layer 104 is formed on the substrate 102, and an N-epitaxy layer 108 is grown on the substrate 102 and N+ buried layer 106. A P+ isolation implant (ISO) 140 is then formed in the N-epitaxy layer 108. An example depth of the ISO region 140 is 14 micrometers.

A dynamic region 20 is established including a Pwell 112, a second Pwell 136 and an Nwell 110, formed on the N-epitaxy region 108. These well regions are formed sufficiently deep to accommodate further diffusions. As an example, Pwell 136, Pwell 112 and an Nwell 110 are formed 4 micrometers deep. A layer of field oxide 138 is then grown on top of the well regions. Shallow contact P+ diffusion regions 114, 118, 120 and 124 and shallow contact N+ diffusion regions 116 and 122 are next formed. As an example, the shallow contact diffusions are formed 0.3 micrometers deep. A dielectric layer 128 and two metallization contact features, namely, Ground connection 132 and Pad connection 134 are applied. It is to be appreciated that other levels of interconnect and intervening dielectric can be added to the described interconnect region 30. The shallow doping regions 114, 116, 118, 120, 122 and 124 and the well regions 110, 112 and 136 are defined herein as the dynamic region. As described infra, by varying the spacing and dimensions of these regions, independent control of the breakdown voltage, NPN critical voltage, NPN critical current, and PNP critical current of the device is provided, which is useful for ESD protection.

Figure 1B:
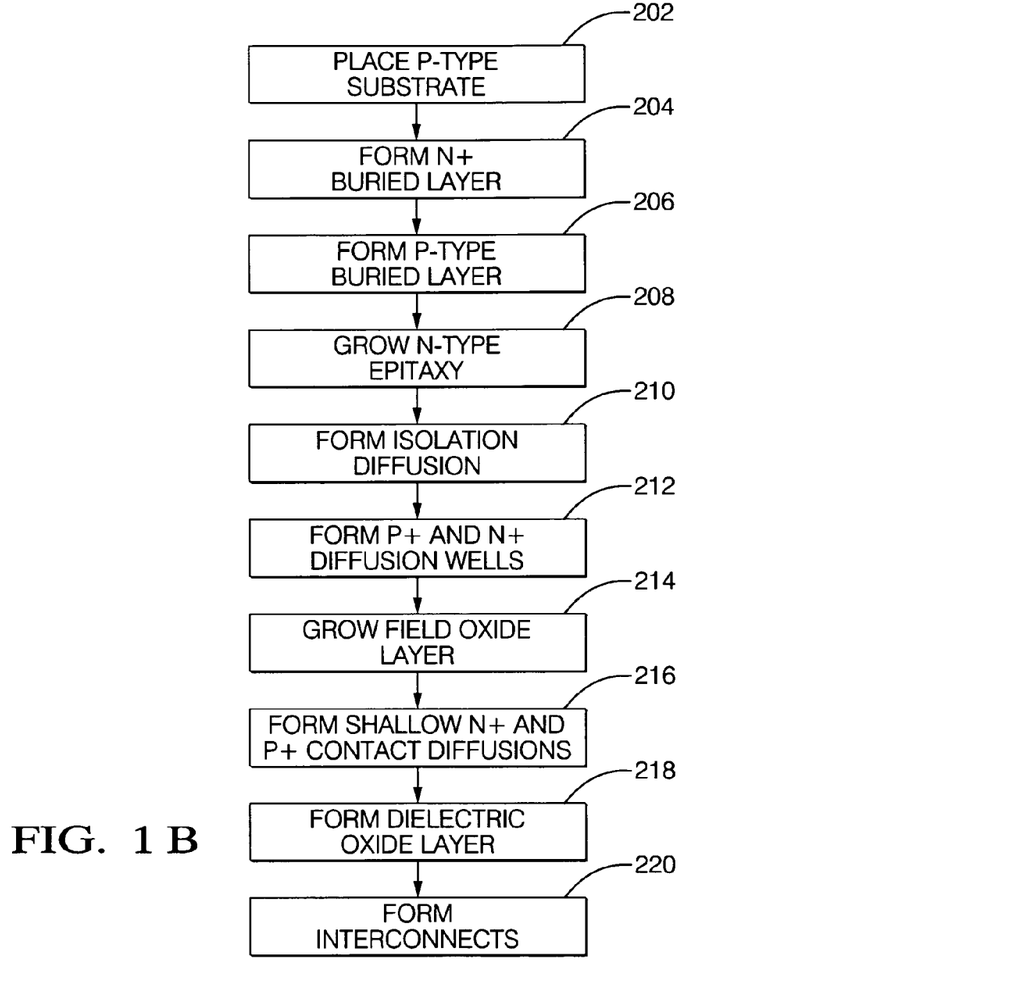
FIG. 1B illustrates example steps in fabrication of the device as in FIG. 1A, in accordance with an embodiment of the present invention.

FIG. 1B illustrates example steps in fabrication of the device as in FIG. 1A, in accordance with an embodiment of the present invention. In step 202, a P-type substrate is positioned, followed by formation of an N+ buried layer in step 204. Next, in step 206, a P buried layer is formed in the P-type substrate, but not contacting the N+ buried layer. In step 208, an N-epitaxy layer is grown. In step 210, a deep isolation diffusion layer is formed and doped with P+ type doping, such that the deep isolation layer contacts the P buried layer and the N epitaxy layer, but does not contact the P substrate or the N+ buried layer. In step 212, a diffusion well of P+ doping (Pwell) is formed on both sides of a diffusion well of N+ doping (Nwell), on the N-epitaxy layer. The Pwells are each separated from the Nwell by an amount of the N-epitaxy. Next, in step 214, a field oxide insulator is grown above the Nwell region. In step 216, two shallow P+ diffusions surrounding and contacting a shallow N+ shallow diffusion are formed in both Pwell regions. Steps 212 and 216 are fabrication steps for the dynamic region. In step 218, a dielectric oxide layer is formed above some of the shallow diffusion layers. In step 220, interconnects are formed. One interconnect contact is positioned above the first Pwell region and the other interconnect contact is positioned above the second Pwell region. The interconnect contact designated Ground 132 contacts the isolation diffusion layer and the P+ and N+ shallow diffusion layers of the first Pwell region. The interconnect contact designated Pad 134 contacts the P+ and N+ shallow diffusion layers of the second Pwell region.

Figure 2A:
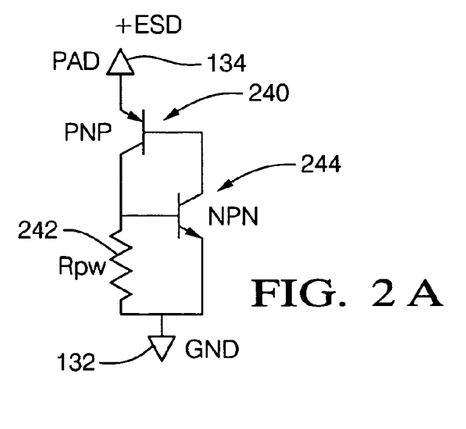
FIG. 2A is a schematic view of a transistor representing a simplified positive voltage operation of an ESD protection device, in accordance with an embodiment of the present invention.

FIG. 2A is a schematic view of a transistor representing a simplified positive voltage operation of an ESD protection device, in accordance with an embodiment of the present invention. The circuit includes a PNP transistor 240, an NPN transistor 244 and a resistor 242 connected in a SCR configuration. The value of the resistance 242 depends upon properties of the Pwell region 112 (FIG. 1A).

Figure 2B:
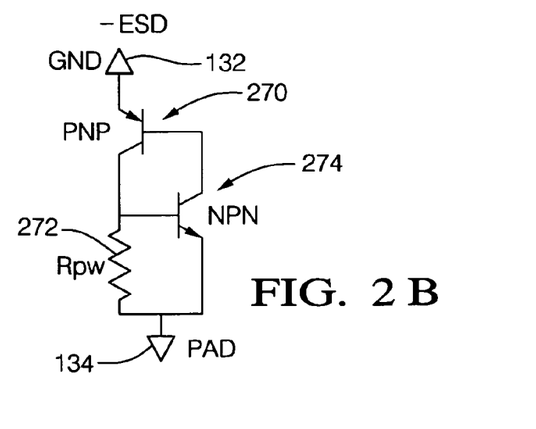
FIG. 2B is a schematic view of a transistor representing a simplified negative voltage operation of an ESD protection device, in accordance with an embodiment of the present invention.

FIG. 2B is a schematic view of a transistor representing a simplified negative voltage operation of an ESD protection device, in accordance with an embodiment of the present invention. As shown in FIG. 2D, the circuit is includes a PNP transistor 270, an NPN transistor 274 and a resistor 272 connected to each other in a SCR configuration. The value of the resistance 272 depends upon properties of the Pwell region 136 (FIG. 1A).

Figure 2C:
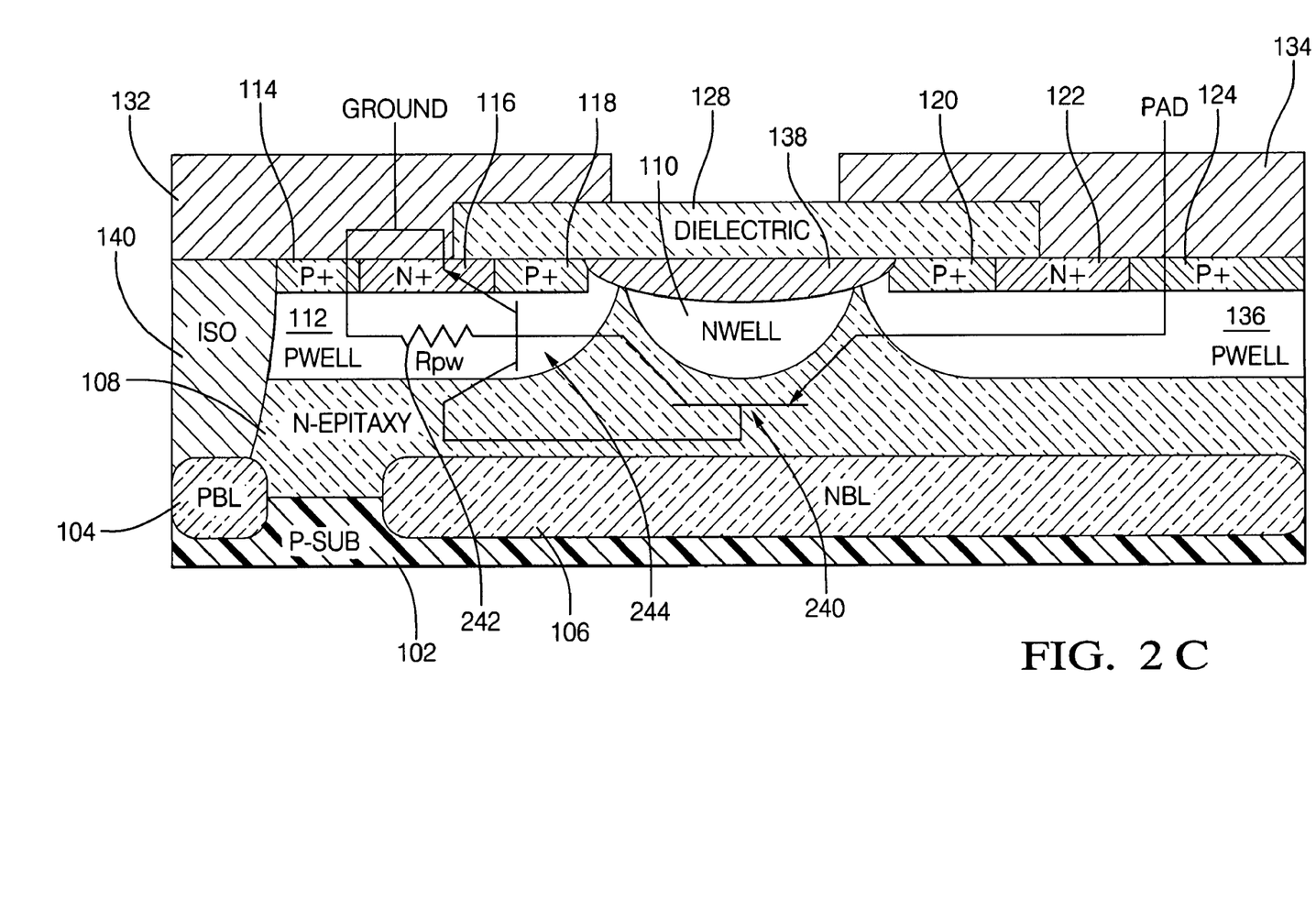
FIG. 2C is cross sectional view illustrating an ESD protection device having an overlay of a simplified electrical schematic for the positive voltage ESD transients, in accordance with an embodiment of the present invention.
Figure 2D:
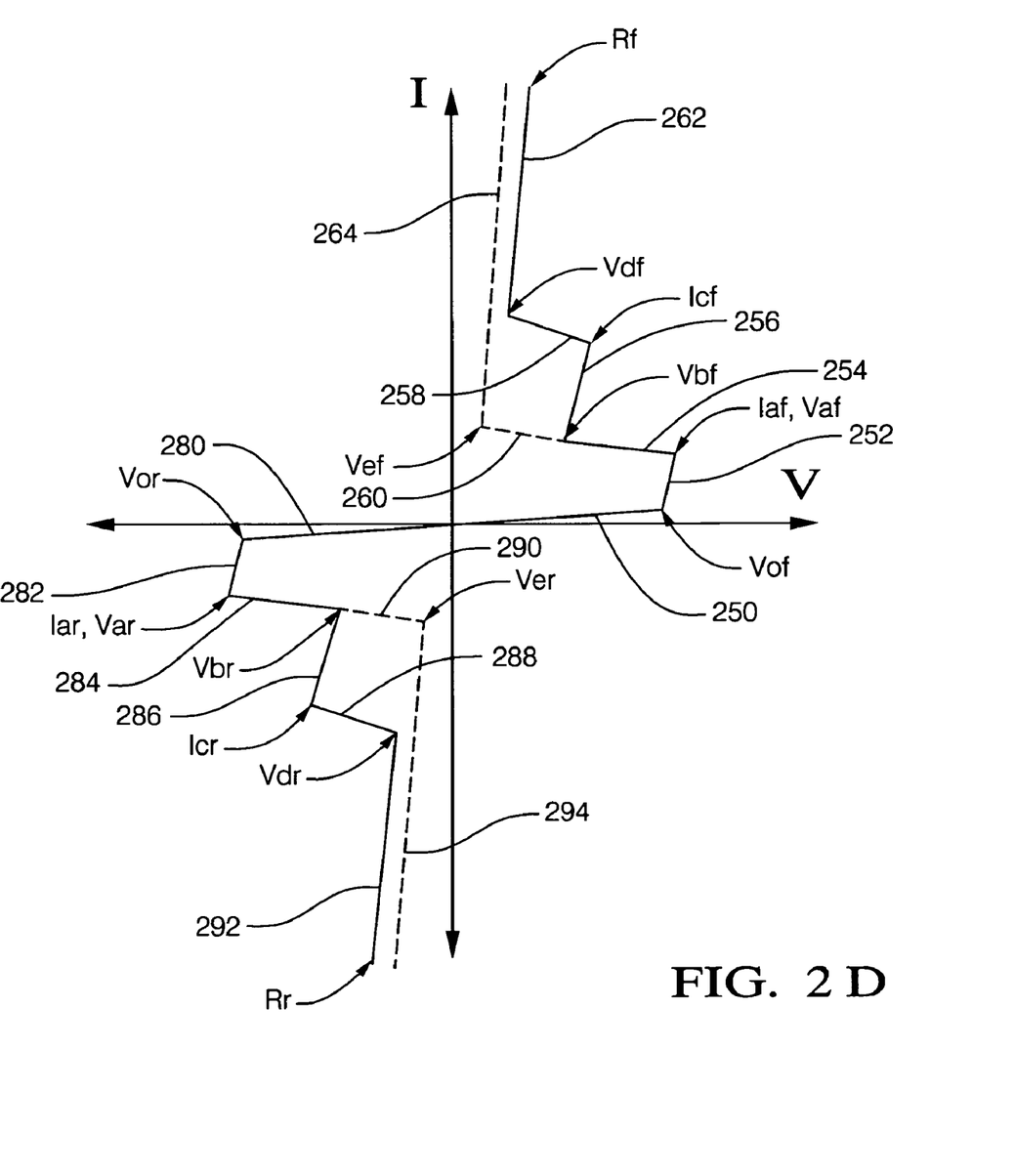
FIG. 2D is a graphical illustration of variable breakdown voltages, critical voltages and critical currents as well as resistances of the device as in FIG. 2A and FIG. 2B, in accordance with an embodiment of the present invention.

FIG. 2C is cross sectional view illustrating an ESD protection device having an overlay of a simplified electrical schematic for the positive voltage ESD transients, in accordance with an embodiment of the present invention. Similarly, the simplified electrical schematic for the negative voltage ESD transient would similarly reflect the schematic view as FIG. 2B.

FIG. 2D is a graphical illustration of variable breakdown voltage, critical voltage and critical currents of the device as in FIG. 2A and FIG. 2B, in accordance with an embodiment of the present invention. Both positive and negative voltage operations (and variable breakdown voltage, critical voltage, and critical currents) are shown, since the present invention provides such a back-to-back SCR operation in both the positive and negative operation, with independently controlled variable breakdown voltage, critical voltage, and critical currents.

The X-axis labeled "V" in FIG. 2D represents the voltage measured between Pad 134 and Ground 132 as in FIG. 1. The Y-axis labeled "I" represents current measured through the device between Pad 134 and Ground 132 plotted on a logarithmic scale. During the regular operation of the device when the voltage measured between the Ground 132 and Pad 134 is small, the transistors between Ground 132 and Pad 134 are turned off, and the present invention device is in off state.

When a positive ESD transient is applied to Pad 134, the voltage measured between Ground 132 and Pad 134 increases, represented by line segment 250 in FIG. 2D. When the rising voltage reaches the forward breakdown voltage (Vof), the Pwell region 112 breaks down into the adjacent N-epitaxy region 108 and Nwell region 110. Current flows from the point of breakdown into the P+ diffusion 118 and Pwell region 112 to the P+ diffusion 114 into the ground 132. Simultaneously, current flows from the point of breakdown into the Nwell region 110 and N-epitaxy 108 junction, across the forward biased Pwell region 136 to N-epitaxy 108 junction, and into the P+ diffusion 124 and Pad 134. Due to the breakdown, the current flowing through Ground 132 and Pad 134 rises. This operation is shown by line segment 252. As the voltage measured between Ground 132 and Pad 134 increases beyond Vof, as indicated in segment 252, an NPN critical voltage (Vaf) and NPN critical current (Iaf) are reached to turn on the NPN having an N+ emitter 116, Pwell base 112 and N-epitaxy collector 108. Once the NPN critical voltage and critical current are reached, the NPN drops back to the BVceo voltage (Vbf) along line segment 254. At this point, the NPN electron current that is being injected into the N-epitaxy region 108 back injects in the forward biased Pwell region 136 and causes the forward injection of hole current from the PNP formed with a Pwell emitter 136, N-epitaxy base 108, and Pwell collector 112. If the product of the NPN and PNP current gain is not at least unity, the device will hold at the NPN BVceo voltage (Vbf). Further increases in current into the pad terminal will cause more NPN electron current to flow into the PNP emitter along line segment 256 until the PNP current gain is sufficient for the PNP to reach the PNP critical current (Icf), at which point the SCR will snap back to the snapback voltage (Vdf) along line segment 258. If however, the PNP current gain is sufficient once the NPN critical current (Iaf) is reached, the SCR will immediately snap back to the snapback voltage (Vef) along line segment 260. Once the snapback voltage is reached (either Vdf or Vef), further increases in terminal current will cause the device voltage to increase along either line segment 262 or 264 with the characteristic resistance Rf.

When a negative ESD transient is applied to Pad 134, the voltage measured between Ground 132 and Pad 134 increases, represented by line segment 280. When the negative voltage reaches the reverse breakdown voltage (Vor), the Pwell region 136 breaks down into the adjacent N-epitaxy region 108 and Nwell region 110. Current flows from the point of breakdown into the P+ diffusion 120 and Pwell region 136 to the P+ diffusion 124 into the pad terminal. Simultaneously, current flows from the point of breakdown into the Nwell region 110 and N-epitaxy region 108, across the forward biased Pwell region 112 to N-epitaxy junction 108, and into the P+ diffusion 114 into the Ground 132. Due to the breakdown, the current flowing through Ground 132 and Pad 134 becomes more negative. This operation is shown by line segment 282. As the voltage measured between Ground 132 and Pad 134 decreases beyond Vor, as indicated in segment 282, a critical voltage (Var) and critical current (Iar) are reached to turn on the NPN having an N+ emitter 122, Pwell base 136, and N-epitaxy collector 108. Once the NPN critical voltage and current area reached, the NPN drops back to the BVceo voltage (Vbr) along line segment 284. At this point, the NPN electron current that is being injected into the N-epitaxy region 108 back injects in the forward biased Pwell region 112 and causes the forward injection of hole current from the PNP formed with a Pwell emitter 112, N-epitaxy base 108, and Pwell collector 136. If the product of the NPN and PNP current gain is not at least unity, the device will hold at the NPN BVceo voltage (Vbr). Further increases in the negative magnitude current into the pad terminal will cause more NPN electron current to flow into the PNP emitter along line segment 286 until the PNP current gain is sufficient for the PNP to reach the PNP critical current (Icr), at which point the SCR will snap back to the snapback voltage (Vdr) along line segment 288. If however, the PNP current gain is sufficient once the NPN critical current (Iar) is reached, the SCR will immediately snap back to the snapback voltage (Ver) along line segment 290. Once the snapback voltage is reached (either Vdr or Ver), further increases in the negative magnitude of terminal current will cause the device voltage to decrease along either line segment 292 or 294 with the characteristic resistance Rr.

Under a positive voltage operation, when a positive ESD transient is applied to the Pad connection 134, a breakdown voltage (Vof), measured from the Ground connection 132 to the Pad connection 134, is adjusted to a wide range of voltages by varying at least one of the spacing of the P+ contact 118 relative to the Nwell region 110 (indicated as dimensions C+D), and the Pwell region 112 relative to the Nwell region 110 (indicated as dimension D). The NPN critical current (Iaf), measured from the Ground connection 132 to the Pad connection 134, is adjusted by varying the width of the N+ diffusion 116 (indicated as width A) multiplied by a sheet resistance of the Pwell region 112 situated adjacent to the N+ diffusion 116. The NPN critical voltage (Vaf), measured from the Ground connection 132 to the Pad connection 134, is adjusted by changing the total resistance from pad terminal P+ diffusion 124 to the ground N+ diffusion 116 (dimensions B through I), or by changing the sheet resistance of the Pwell region 136, the Nwell region 110, or the Pwell region 112. The NPN BVceo voltage (Vbf) can be changed by adjusting the NPN current gain, which is adjusted by changing the doping level or junction depth of the Pwell region 112 underneath the N+ diffusion 116, or by changing the breakdown voltage between the Pwell region 112 and the N-epitaxy region 108. The PNP critical current (Icf), measured from the Ground connection 132 to the Pad connection 134, is adjusted by changing the current gain of the PNP which is adjusted by changing the spacing between the Pwell region 112 and the Pwell region 136 (dimensions D+E+F), or by varying the relative doping levels of the Pad side Pwell region 136 and the base region (N-epitaxy 108). After the PNP critical current (Icf) is reached, the SCR snaps back to the snapback voltage (Vdf) and further increases in current causing the device to turn on with a characteristic resistance (Rf). If the PNP current gain is greater than unity for an NPN critical current (Iaf), then the PNP will turn on when the SCR reaches Iaf and the SCR will go to the snapback voltage (Vef), bypassing the NPN BVceo voltage (Vbf) and PNP critical current (Icf). By adjusting the PNP current gain, the device can be designed to either follow the path including Vbf to Icf to Vdf, or it can be designed to follow the path including Vef.

Under a negative voltage operation, when the NPN emitter is situated on the Pad side 134 and the PNP emitter is situated on the ground side 132, the design parameters for the breakdown voltages, critical voltages and critical currents are the opposite of that for positive voltage device operation as described above. The ISO region 140 may act as a second PNP emitter, and can also be used independently to adjust the PNP current gain and hence independently impact where the device traces out a path Iar to Vbr to Icr to Vdr, or a path Iar to Ver.

Figure 3:
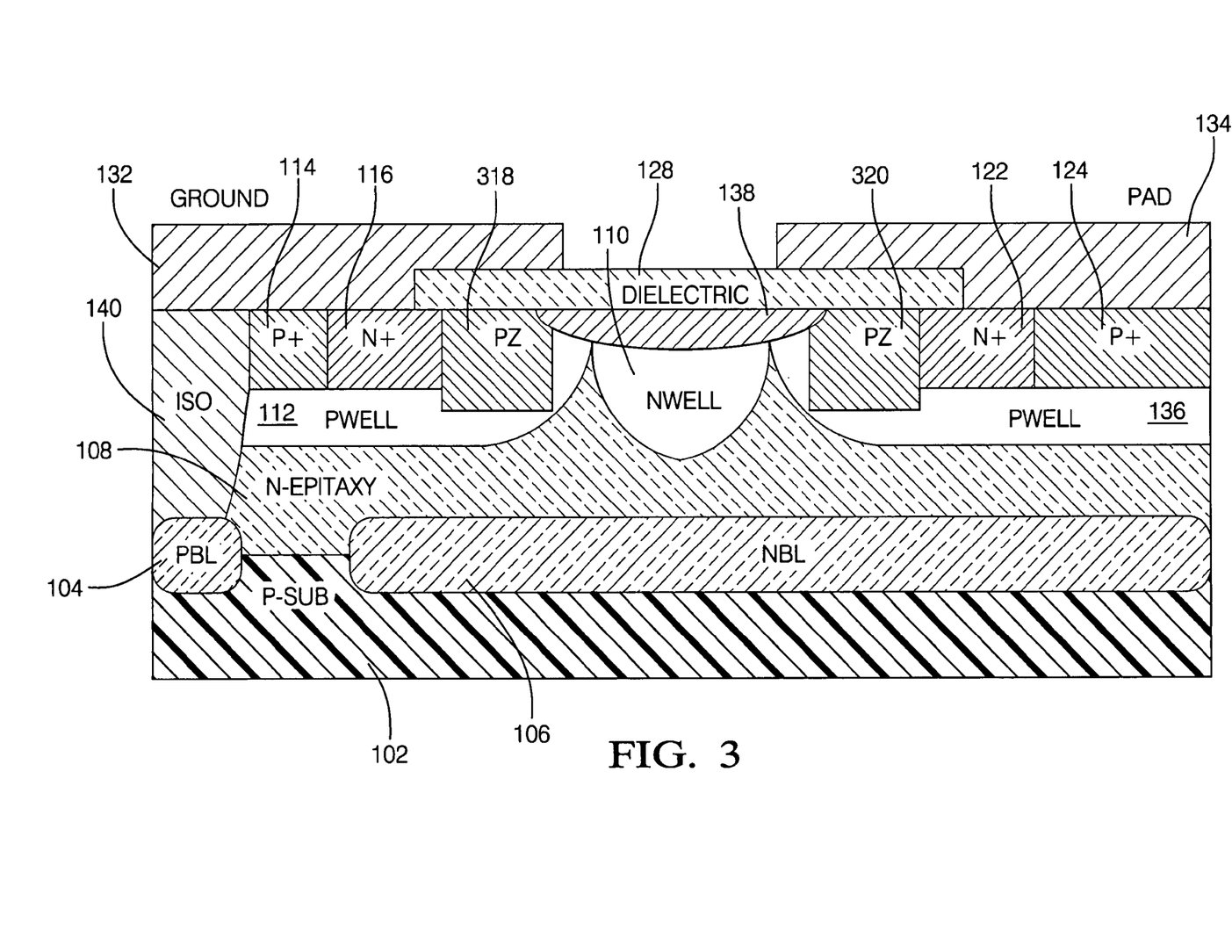
FIG. 3 is cross sectional view illustrating an ESD protection device with a P+ Zener implant, in accordance with an embodiment of the present invention.

FIG. 3 is cross sectional view illustrating an ESD protection device with a P+ Zener implant, in accordance with an embodiment of the present invention. The P+ doping regions 118 and 120 of FIG. 1A are replaced by P+ Zener implant PZ 318 and PZ 320. The illustrated ESD protection device, like the previously shown device, functions as a back-to-back SCR in both a positive and negative operation, with independently controlled variable breakdown voltages, critical voltages, and critical currents. The use of PZ regions 318 and 320 causes a different breakdown voltage as compared with the device shown in FIG. 1A. However, the same positive and negative voltage operation characteristics apply as that shown in FIG. 1A. Also, the lighter doped PZ regions 318 and 320 change the absolute values of Vof and Vor. Thus, by changing two doping regions in the dynamic region, a designer can meet a desired ESD protection design.

The ESD protection device in FIG. 3A is fabricated in a substantially similar manner as described in steps 202, 204, 206, 208, 210, 212, 214, 218 and 220 of FIG. 1B. The P+ diffusions 118 and 120 are however replaced with a P+ Zener implant region.

Figure 4A:
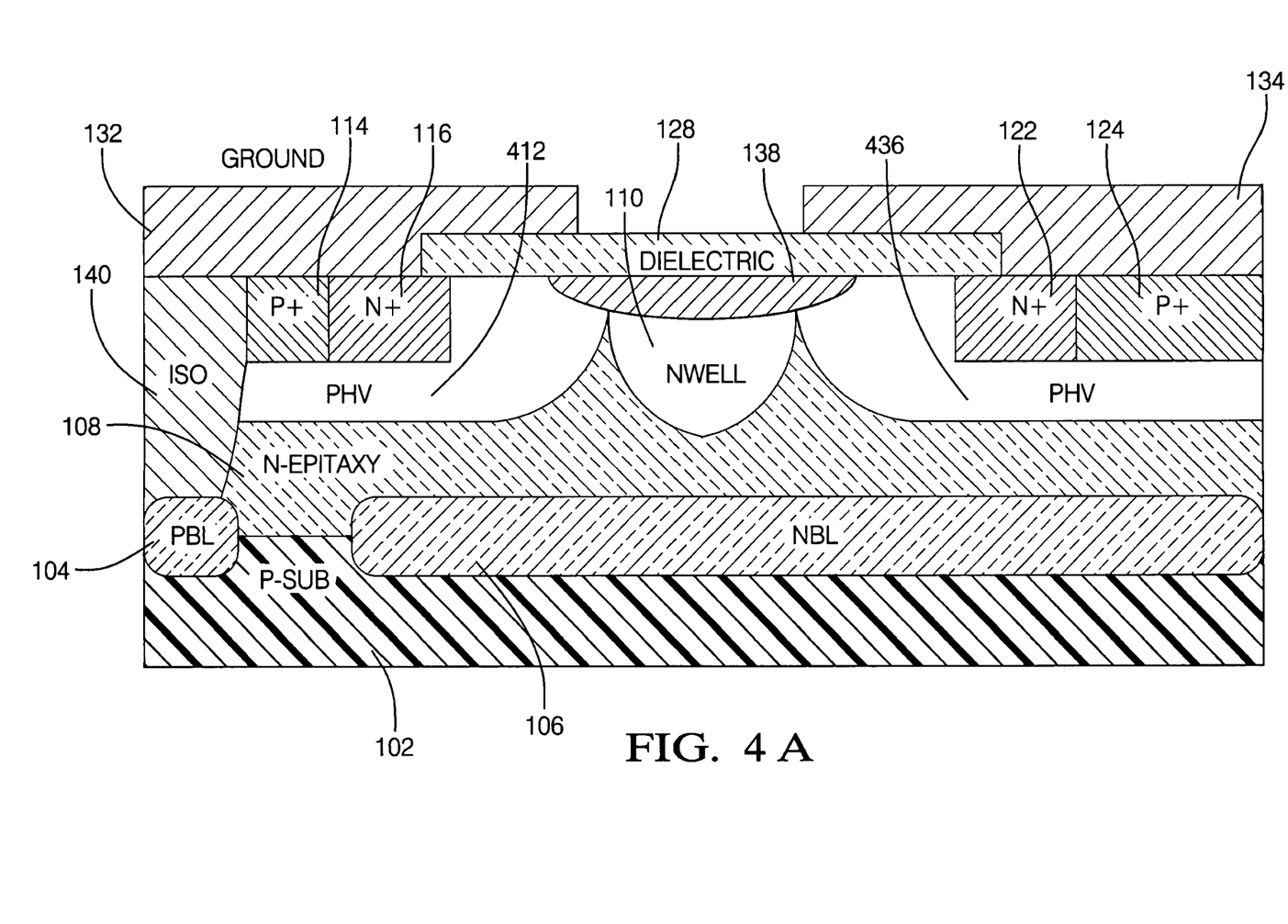
FIG. 4A is cross sectional view illustrating an ESD protection device with a P-type high voltage implant, in accordance with an embodiment of the present invention.

FIG. 4A is cross sectional view illustrating an ESD protection device with a P-type high voltage implant, in accordance with an embodiment of the present invention. The P+ doping regions 118, 120, and the Pwell regions 112, 136 of FIG. 1A are replaced by P-type High Voltage (PHV) regions PHV 412 and PHV 436. In an example, the PHV 412 and 436 implants are formed 2.5 micrometers deep. The illustrated ESD protection device, like the previously shown device, functions as a back-to-back SCR in both a positive and negative operation, with independently controlled variable breakdown voltages, critical voltages, and critical currents. The use of PHV regions 412 and 436 causes a higher breakdown voltage as compared with the device shown in FIG. 1A. However, the same positive and negative voltage operation characteristics apply as that shown in FIG. 1A. Also, the absolute values of Vof and Vor are changed. Thus, by changing two doping regions in the dynamic region, a designer can meet a desired ESD protection design.

The ESD protection device in FIG. 4A is fabricated in a substantially similar manner as described in steps 202, 204, 206, 208, 210, 214, 218 and 220 of FIG. 1B. The P+ diffusions 118 and 120, and the Pwell regions 112 and 136, are however replaced with a P-type High Voltage (PHV) region.

Figure 4B:
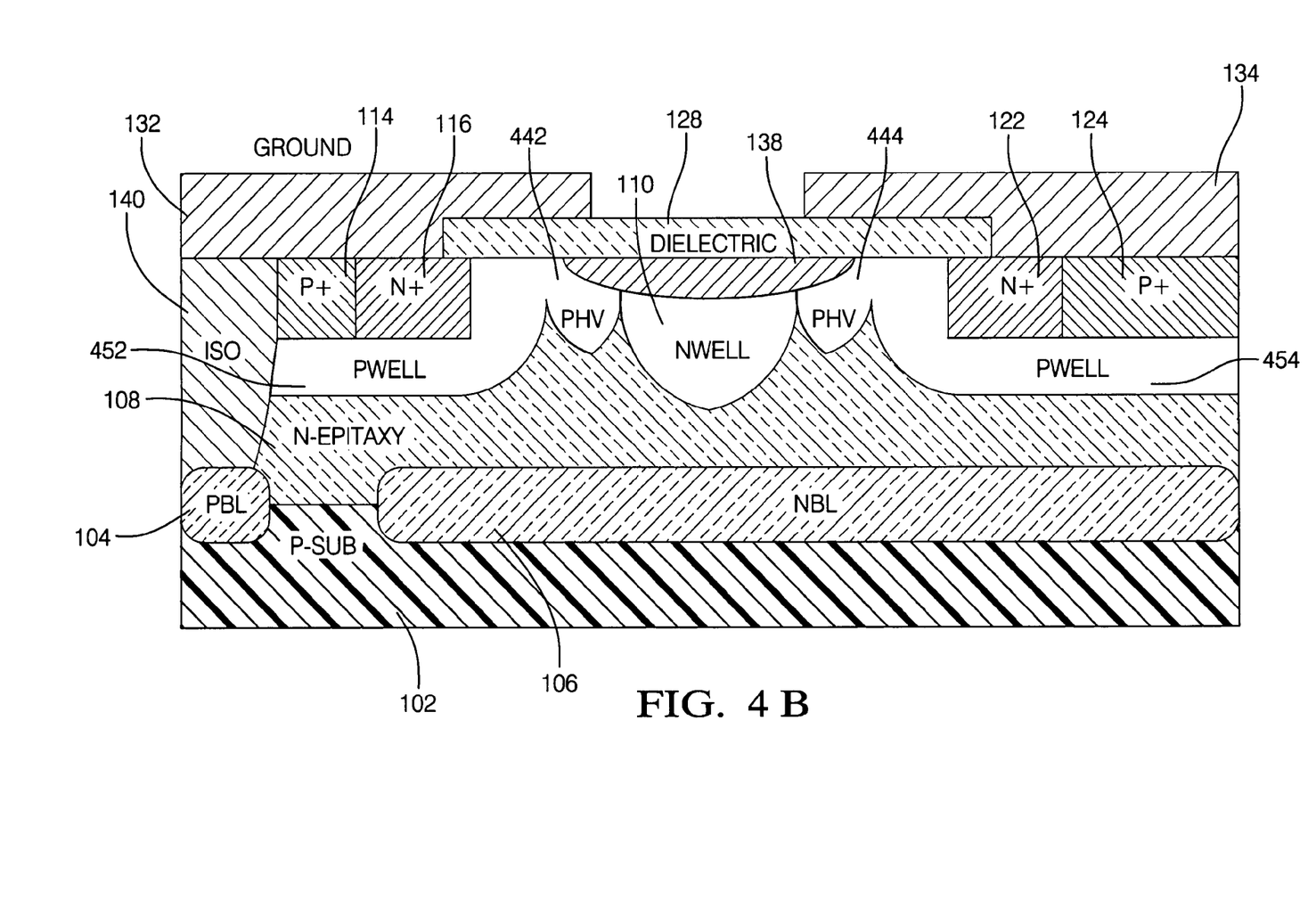
FIG. 4B is cross sectional view illustrating an ESD protection device with another design version P-type high voltage implant, in accordance with an embodiment of the present invention.

FIG. 4B is a cross sectional view illustrating an ESD protection device with another P-type high voltage implant (PHV), in accordance with an embodiment of the present invention. The dynamic region in this device is modified to include PHV regions separating Pwell and Nwell regions. As shown, the Nwell region 110 is relatively unchanged from the device in FIG. 1A. However, both the Pwell regions 452 and 454 are reduced such that PHV doping regions 442 and 444 are added between the reduced Pwell regions 452 and 454 and the Nwell region 110. The illustrated ESD protection device, like the previously shown devices, functions as a back-to-back SCR in both a positive and negative operation, with independently controlled variable breakdown voltages, critical voltages, and critical currents. The use of PHV regions 442 and 444 causes a different breakdown voltage as compared with the device shown in FIG. 1A. However, the same positive and negative voltage operation characteristics apply as that shown in FIG. 1A. Thus, by changing doping regions in the dynamic region, a designer can meet a desired ESD protection design.

The ESD protection device in FIG. 4B is fabricated in a substantially similar manner as described in steps 202, 204, 206, 208, 210, 214, 218 and 220 of FIG. 1B. However, the P+ diffusions 118 and 120 are removed, and the Pwell regions 112 and 136 are reduced, such that P-type High Voltage (PHV) regions are included.

Figure 5A:
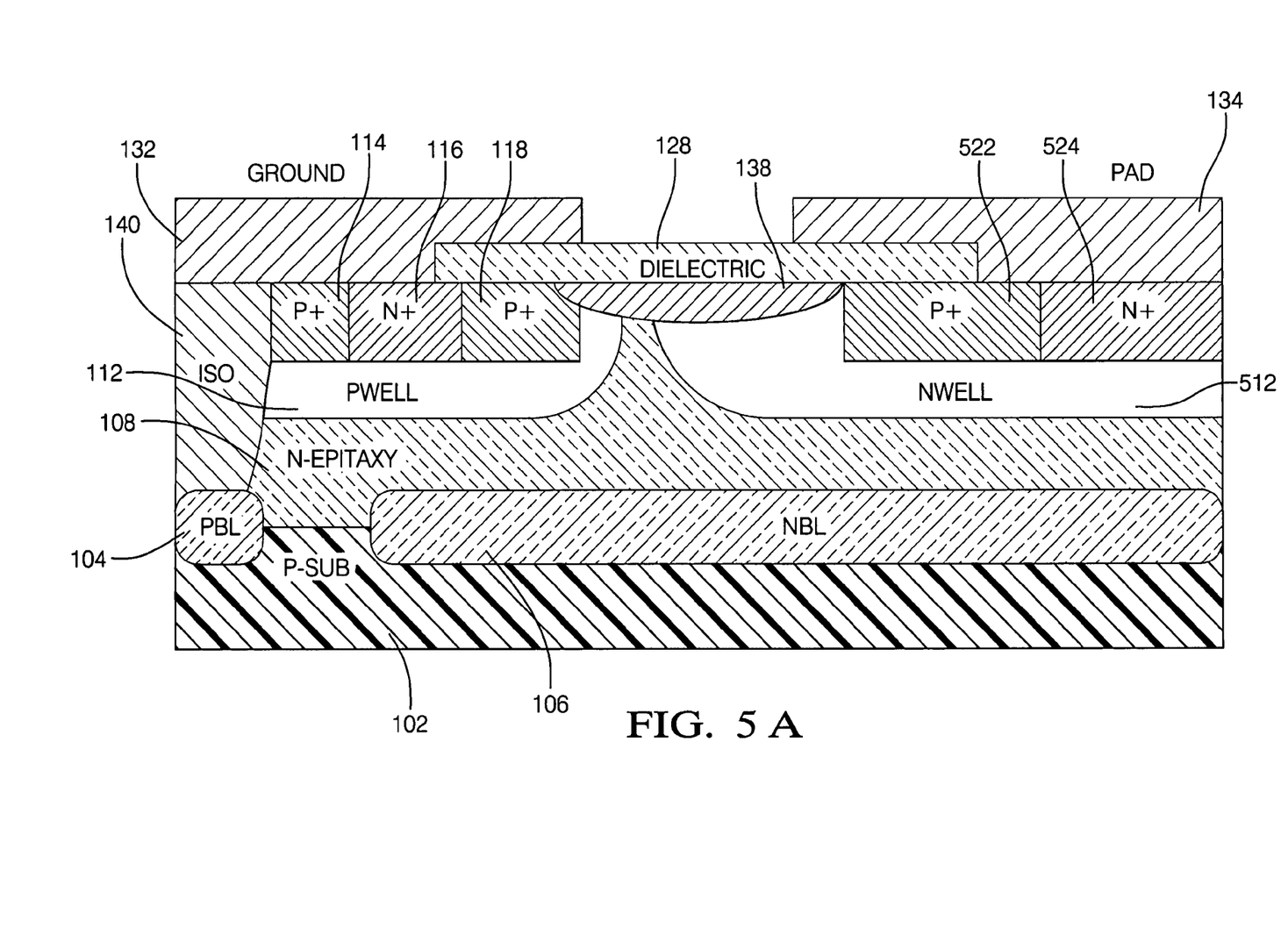
FIG. 5A is cross sectional view illustrating an ESD protection device that operates as an SCR for positive voltage and a simple diode for negative voltage, in accordance with an embodiment of the present invention.

FIG. 5A is cross sectional view illustrating an ESD protection device that operates as an SCR for positive voltage and a simple diode for negative voltage, in accordance with an embodiment of the present invention. The dynamic region in this device is modified from FIG. 1A such that the device behaves as an SCR when a positive voltage ESD is applied between Pad 134 and Ground 132, and behaves like a simple diode when negative voltage ESD is applied between Pad 134 and Ground 132. Compared to the device of FIG. 1A, the Nwell region 512 is stretched under the Pad-side shallow doping regions, with Pwell region 136 and P+ diffusion region 124 eliminated. Also, there are two shallow doped regions, namely a P+ region 522 that contacts the Pad connection 134 and the stretched Nwell region 512, and an N+ region 524 that contacts the Pad connection 134 and the stretched Nwell region 512.

Figure 5B:
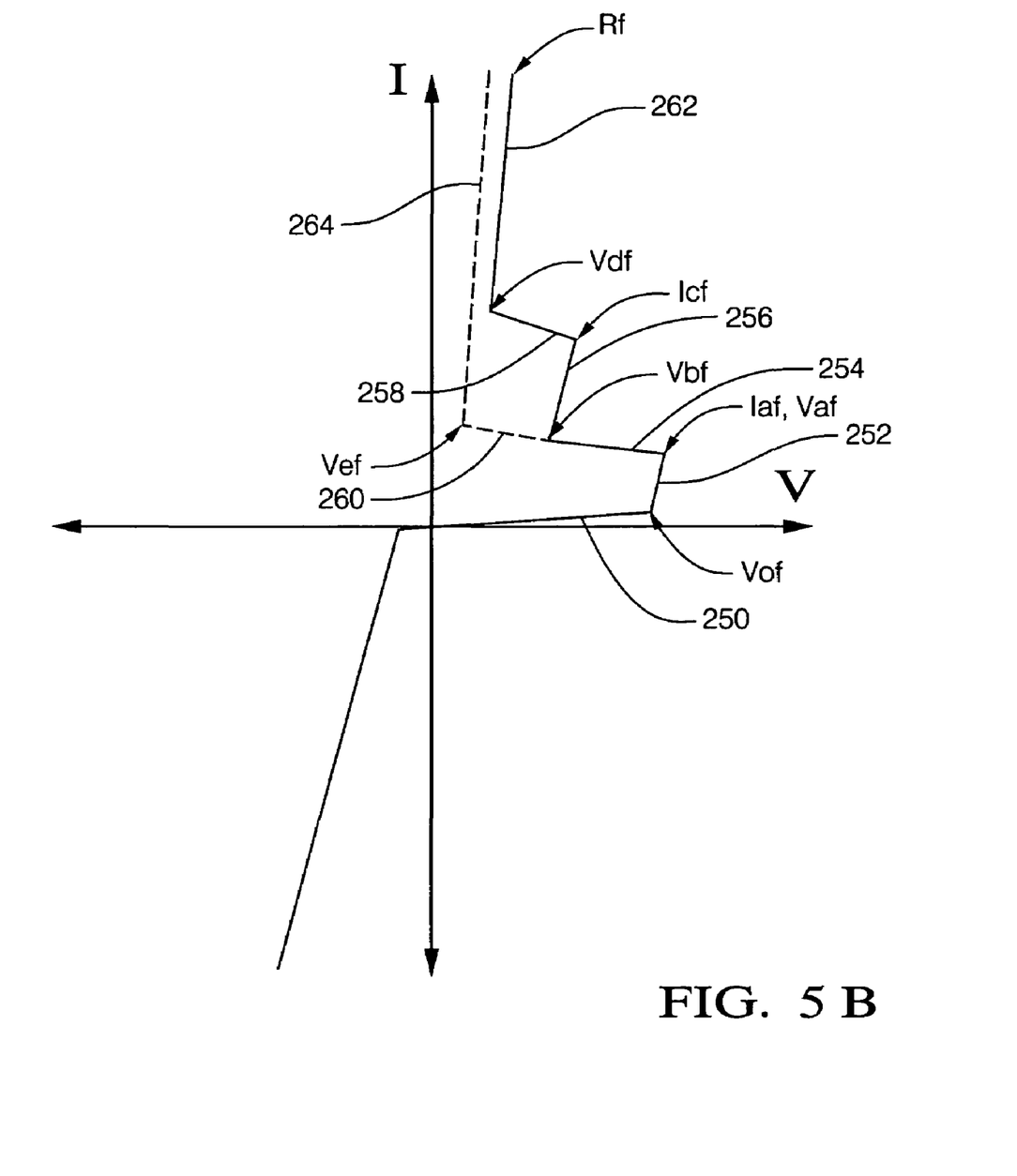
FIG. 5B is a graphical illustration of variable breakdown voltages, critical voltages and critical currents, as well as resistances of the device as in FIG. 5A, in accordance with an embodiment of the present invention.

As shown in FIG. 5B, for the SCR design in the positive voltage, the same variable voltage operation characteristics apply as that shown in FIG. 1A, except that the PNP is formed with a P+ emitter 522, Nwell base 512, and Pwell collector 112. The PNP current gain and thus PNP critical current is regulated by changing the junction depth or doping concentration of the Nwell region 512, or by changing the width of the P+ region 522. The device would act as a simple diode for the negative voltage. Also, the NPN critical voltage is adjusted by varying a resistance measured from the N+ contact 116 to the N+ contact 524, or a sheet resistance of the Pwell region 112, and a sheet resistance of the Nwell region 512.

The ESD protection device in FIG. 5A is fabricated in a substantially similar manner as described in steps 202, 204, 206, 208, 210, 214, 218 and 220 of FIG. 1B. However, the Nwell region 512 is stretched under the Pad-side shallow doping regions, with Pwell region 136 and P+ diffusion region 124 eliminated. Also, the P+ diffusion 522 contacts the Pad connection 134.

Figure 6:
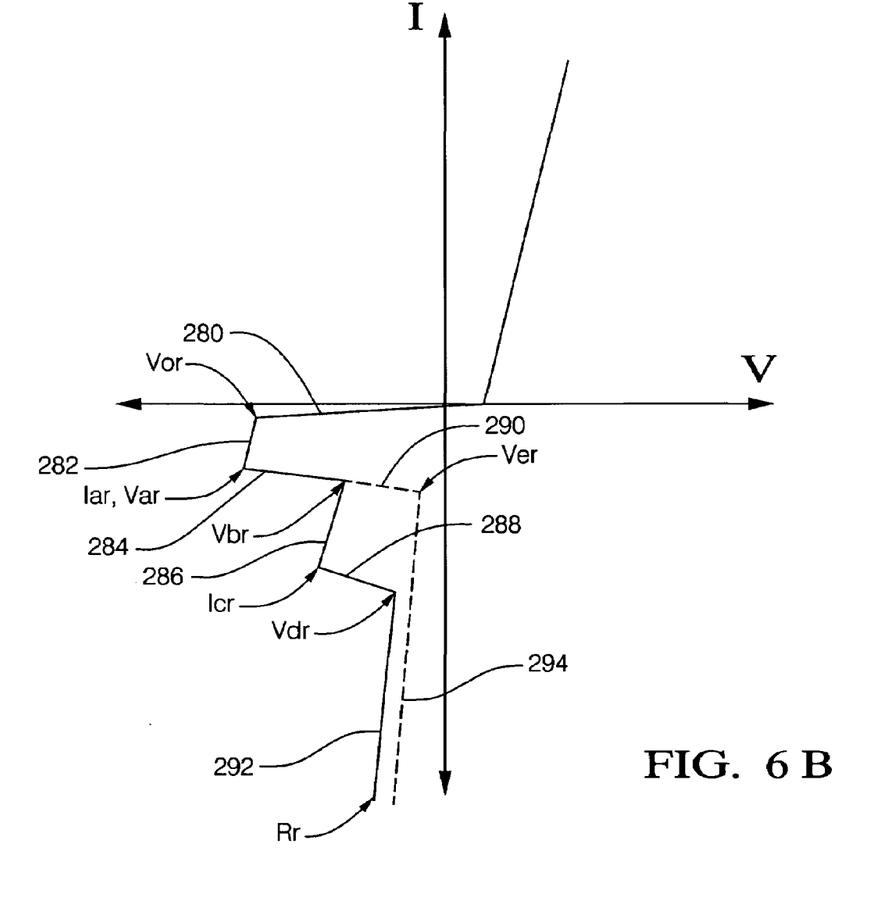
FIG. 6A is cross sectional view illustrating an ESD protection device that operates as a simple diode for positive voltage and an SCR for negative voltage, in accordance with an embodiment of the present invention.
FIG. 6B is a graphical illustration of variable breakdown voltages, critical voltages and critical currents, as well as resistances of the device as in FIG. 6A, in accordance with an embodiment of the present invention.
Figure 6A:
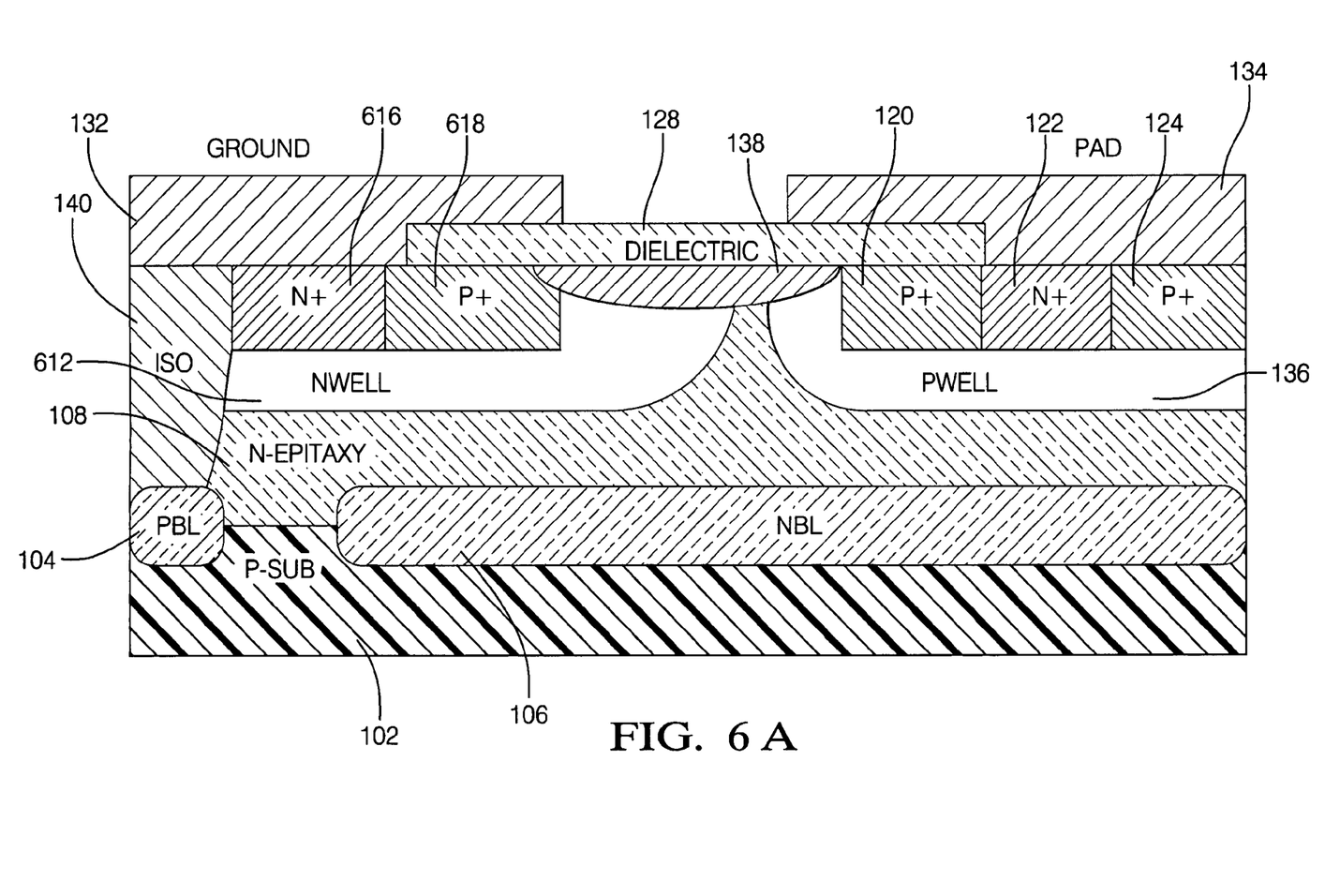

FIG. 6A is cross sectional view illustrating an ESD protection device that operates as a simple diode for positive voltage and an SCR for negative voltage, in accordance with an embodiment of the present invention. The dynamic region in this device is modified from FIG. 1A such that the device behaves as a simple diode when a positive voltage ESD is applied between Pad 134 and Ground 132, and behaves like an SCR when negative voltage ESD is applied between Pad 134 and Ground 132. Compared to the device of FIG. 1A, the Nwell region 612 is stretched under the Ground-side shallow doping regions, with Pwell region 112 and P+ diffusion region 114 eliminated. Also, there are two shallow doped regions, namely a P+ region 618 that contacts the Ground connection 132 and the stretched Nwell region 612, and an N+ region 616 that contacts the Ground connection 132 and the stretched Nwell region 612.

As shown in FIG. 6B, for the SCR design in the negative voltage, the same variable voltage operation characteristics apply as that shown in FIG. 1A, except that the PNP is formed with a P+ emitter 618, Nwell base 612, and Pwell collector 136. The PNP current gain and thus PNP critical current is regulated by changing the junction depth or doping concentration of the Nwell region 612, or by changing the width of the P+ region 618. The device would act as a simple diode for the positive voltage. Also, the NPN critical voltage is adjusted by varying a resistance measured from the N+ contact 122 to the N+ contact 616, or a sheet resistance of the Pwell region 136, and a sheet resistance of the Nwell region 612.

The ESD protection device in FIG. 6A is fabricated in a substantially similar manner as described in steps 202, 204, 206, 208, 210, 214, 218 and 220 of FIG. 1B. However, the Nwell region 612 is stretched under the Ground-side shallow doping regions, with Pwell region 112 and P+ diffusion region 114 eliminated. Also, the P+ diffusion 618 contacts the Ground connection 132.

A further understanding of the above description can be obtained by reference to the following experimental result examples that are provided for illustrative purposes and are not intended to be limiting.

Figure 7:
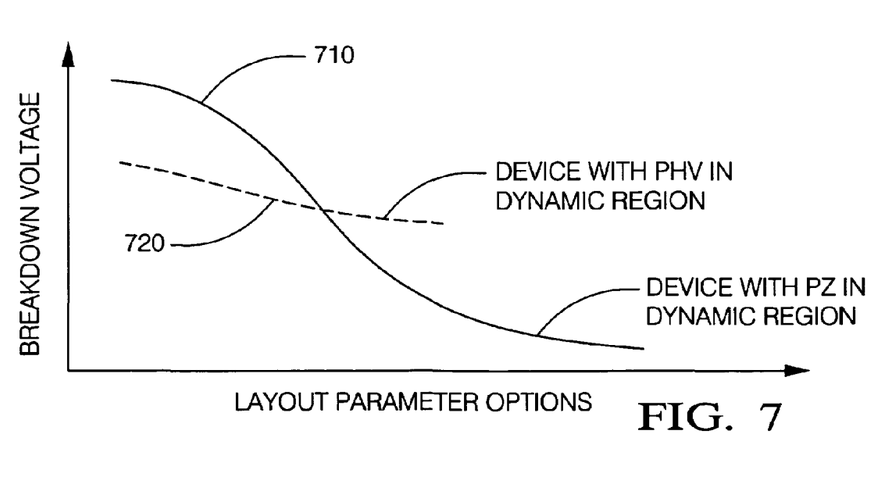
FIG. 7 is a graphical illustration of example breakdown voltages for a P+ Zener implant and a P-type high voltage implant device, in accordance with embodiments of the present invention.

FIG. 7 is a graphical illustration of example breakdown voltages for a P+ Zener implant and a P-type high-voltage implant device (as shown in FIGS. 3 and 4A, respectively), in accordance with embodiments of the present invention. The x-axis labeled "Layout Parameter Options" represents the dynamic region variations for the P+ Zener implant and a P-type high-voltage implant previously described. The y-axis represents the value of breakdown voltage for the device using a particular layout parameter option. Curve 710 labeled "Device with PZ in the Dynamic region" shows the properties of a device with PZ doping region in the Dynamic region. Curve 720 labeled "Device with PHV in the Dynamic region" shows the properties of a device with PHV doping region in the Dynamic region. As shown in FIG. 7, the device structures of the present invention provide flexible control to select a desired breakdown voltage. For example, as shown by curve 710, devices formed with a PZ region provide a wide range of breakdown voltages but a rapid change in breakdown voltage. As a further example, as shown by curve 720, devices formed with a P-type hi-voltage implant provide a narrower breakdown voltage range but provide less breakdown voltage variation as the layout parameters change.

Other features and advantages of this invention will be apparent to a person of skill in the art who studies this disclosure. Thus, exemplary embodiments, modifications and variations may be made to the disclosed embodiments while remaining within the spirit and scope of the invention as defined by the appended claims.

We claim:

1. An electrostatic discharge protection device, comprising:
    an interconnect region having a first interconnect and a second interconnect;
    a dynamic region including a first Pwell region contacting the first interconnect, a second Pwell region contacting the second interconnect, and an Nwell region situated between the first Pwell region and the second Pwell region, wherein the first Pwell region includes a first P+ contact, a first N+ contact and a second P+ contact, and wherein the second Pwell region includes a third P+ contact, a second N+ contact and a forth P+ contact; and
    a platform region including an N-doped base region situated adjacent to the first Pwell region and the second Pwell region;
    wherein at least one of a breakdown voltage, an NPN critical voltage, and an NPN critical current, measured from the first interconnect to the second interconnect, is adjustable, wherein the breakdown voltage is adjusted by varying at least one of spacing of the second P+ contact relative to the Nwell region, the first Pwell region relative to the Nwell region, the third P+ contact relative to the Nwell region and the second Pwell region relative to the Nwell region, wherein the NPN critical voltage is adjusted by varying one of a resistance from the first N+ contact to the forth P+ contact, a resistance from the first P+ contact to the second N+ contact, and a sheet resistance of the second Pwell region, the Nwell region, and the first Pwell region, and wherein the NPN critical current is adjusted by varying one of a width of the first N+ contact multiplied by a sheet resistance of the first Pwell region situated adjacent to the first N+ contact, and a width of the second N+ contact multiplied by a sheet resistance of the second Pwell region situated adjacent to the second N+ contact.

2. The electrostatic discharge protection device as in claim 1, wherein a PNP critical current, measured from the first interconnect to the second interconnect, is adjustable by varying a distance between the first Pwell region relative to the second Pwell region, and the doping of the N-doped base region.

3. The electrostatic discharge protection device as in claim 1, wherein the first Pwell region includes a P+ Zener implant to adjust the breakdown voltage.

4. The electrostatic discharge protection device as in claim 1, wherein the first Pwell region includes a P-type high voltage region to adjust the breakdown voltage.

5. The electrostatic discharge protection device as in claim 1, wherein the platform region further includes a P-doped substrate, a P-doped buried layer, and a P-doped isolated diffusion, and wherein the N-doped base region is formed of an N-epitaxy.

6. The electrostatic discharge protection device as in claim 1, wherein the breakdown voltage is one of a positive voltage and a negative voltage.

7. The electrostatic discharge protection device as in claim 1, wherein a snapback voltage, measured from the first interconnect to the second interconnect, is adjusted by varying a PNP current gain for the NPN critical current.

8. An electrostatic discharge protection device, comprising:
an interconnect region having a first interconnect and a second interconnect;
a dynamic region including a Pwell region contacting the first interconnect, and an Nwell region situated substantially adjacent to the Pwell region and contacting the second interconnect, wherein the Pwell region includes a first P+ contact, a first N+ contact and a second P+ contact, and wherein the Nwell region includes a third P+ contact, and a second N+ contact; and
a platform region including an N-doped base region situated adjacent to the Pwell region and the Nwell region;
wherein at least one of a breakdown voltage, an NPN critical voltage, and an NPN critical current, measured from the first interconnect to the second interconnect, is adjustable,
wherein the breakdown voltage is adjusted by varying at least one of spacing of the second P+ contact relative to the Nwell region, and the Pwell region relative to the Nwell region,
wherein the NPN critical voltage is adjusted by varying one of a resistance measured from the first N+ contact to the second N+ contact, a sheet resistance of the Pwell region, and a sheet resistance of the Nwell region, and wherein the NPN critical current is adjusted by varying a width of the first N+ contact multiplied by a sheet resistance of the Pwell region situated adjacent to the first N+ contact.

9. The electrostatic discharge protection device as in claim 8, wherein a PNP critical current, measured from the first interconnect to the second interconnect, is adjusted by varying the width of the third P+ contact multiplied by a sheet resistance of the Nwell region situated adjacent to the third P+ contact.

10. The electrostatic discharge protection device as in claim 8, wherein the Pwell region includes a P+ Zener implant to adjust the breakdown voltage.

11. The electrostatic discharge protection device as in claim 8, wherein the Pwell region includes a P-type high voltage region to adjust the breakdown voltage.

12. The electrostatic discharge protection device as in claim 8, wherein the platform region further includes a P-doped substrate, a P-doped buried layer, and a P-doped isolated diffusion, and wherein the N-doped base region is formed of an N-epitaxy.

13. The electrostatic discharge protection device as in claim 8, wherein the breakdown voltage is one of a positive voltage and a negative voltage.

14. The electrostatic discharge protection device as in claim 8, wherein a snapback voltage, measured from the first interconnect to the second interconnect, is adjusted by varying a PNP current gain for the NPN critical current.

15. A method of protecting against electrostatic discharge comprising:
establishing an interconnect region having a first interconnect and a second interconnect;
establishing a dynamic region including a first Pwell region contacting the first interconnect, a second Pwell region contacting the second interconnect, and an Nwell region situated between the first Pwell region and the second Pwell region, wherein the first Pwell region includes a first P+ contact, a first N+ contact and a second P+ contact, and wherein the second Pwell region includes a third P+ contact, a second N+ contact and a forth P+ contact; and
establishing a platform region including an N-doped base region situated adjacent to the first Pwell region and the second Pwell region;
wherein at least one of a breakdown voltage, an NPN critical voltage, and an NPN critical current, measured from the first interconnect to the second interconnect, is adjustable,
wherein the breakdown voltage is adjusted by varying at least one of spacing of the second P+ contact relative to the Nwell region, the first Pwell region relative to the Nwell region, the third P+ contact relative to the Nwell region and the second Pwell region relative to the Nwell region, and
wherein the NPN critical voltage is adjusted by varying one of a resistance from the first N+ contact to the forth P+ contact, a resistance from the first P+ contact to the second N+ contact, and a sheet resistance of the second Pwell region, the Nwell region, and the first Pwell region,
wherein the NPN critical current is adjusted by varying one of a width of the first N+ contact multiplied by a sheet resistance of the first Pwell region situated adjacent to the first N+ contact, and a width of the second N+ contact multiplied by a sheet resistance of the second Pwell region situated adjacent to the second N+ contact.

16. The method as in claim 15, further comprising adjusting a PNP critical current, measured from the first interconnect to the second interconnect, by varying distance between the first Pwell region relative to the second Pwell region, and the doping of the N-doped base region.

17. The method as in claim 15, further comprising utilizing a P+ Zener implant within the first Pwell region to adjust the breakdown voltage.

18. The method as in claim 15, further comprising utilizing a P-type high voltage region within the first Pwell region to adjust the breakdown voltage.

19. The method as in claim 15, wherein the breakdown voltage is one of a positive voltage and a negative voltage.

20. The method as in claim 15, further comprising adjusting a snapback voltage, measured from the first interconnect to the second interconnect, by varying a PNP current gain for the NPN critical current.

* * * * *